(12) United States Patent  (10) Patent No.: US 8,717,104 B1
Williams  (45) Date of Patent: May 6, 2014

(54) VECTOR VOLTAGE SAMPLERS FOR RF INTERFACE CONTROL OF POWER AMPLIFIER

(75) Inventor: Wyman Williams, Johns Creek, GA (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 13/372,934

(22) Filed: Feb. 14, 2012

Related U.S. Application Data

(60) Provisional application No. 61/443,991, filed on Feb. 17, 2011.

(51) Int. Cl.
*H03F 3/191* (2006.01)

(52) U.S. Cl.
USPC .......................................................... 330/305

(58) Field of Classification Search
USPC ........... 330/302, 305, 2; 333/17.3, 25, 26, 32, 333/33
See application file for complete search history.

(56) References Cited

U.S. PATENT DOCUMENTS

| | | | | |
|---|---|---|---|---|
| 6,768,472 B2* | 7/2004 | Alexopoulos et al. | ......... | 343/860 |
| 6,895,225 B1* | 5/2005 | Talvitie et al. | ................ | 330/302 |
| 7,379,714 B2* | 5/2008 | Haque et al. | .................. | 455/107 |
| 7,929,987 B2* | 4/2011 | Lee et al. | ...................... | 330/302 |
| 8,072,285 B2* | 12/2011 | Spears et al. | ................. | 333/17.3 |
| 8,294,514 B2* | 10/2012 | Visser et al. | .................. | 330/305 |

* cited by examiner

*Primary Examiner* — Khanh V Nguyen
(74) *Attorney, Agent, or Firm* — William L. Botjer

(57) ABSTRACT

A system for compensating impedance mismatch at an output terminal of a RF power amplifier is disclosed. In an embodiment, the system includes a plurality of samplers to measure a first set of parameters associated with an amplified signal being generated by the power amplifier. The first set of parameters is transmitted to a processing unit. The processing unit varies an impedance of an impedance element based on the first set of parameters. The impedance element is connected to the output terminal of the power amplifier.

16 Claims, 3 Drawing Sheets

VECTOR VOLTAGE SAMPLERS FOR RF INTERFACE CONTROL OF POWER AMPLIFIER

CROSS REFERENCE TO RELATED APPLICATION

This application claims priority from U.S. provisional application No. 61/443,991 titled: "ON-CHIP VECTOR VOLTAGE SAMPLERS FOR RF INTERFACE CONTROL OF POWER AMPLIFIER" filed Feb. 17, 2011 the disclosure of which is hereby incorporated by reference.

FIELD

The present disclosure relates, in general, to a power amplifier. More specifically, the present disclosure relates to techniques for compensating impedance mismatch at an output terminal of a power amplifier.

BACKGROUND

Advancements in the field of communication have led to the development of electronic devices having communication capabilities. Usually, such electronic devices may include wired or wireless interfaces for communication purposes. Examples of such electronic devices may include, but are not limited to, mobile phones, tablets, computers, televisions, sensors, etc. Many of the electronic devices available these days include a wireless interface for communication purposes.

A typical electronic device with a wireless interface includes an antenna system and a power amplifier circuit. Further, the electronic device may include a modulation circuit that generates a Radio Frequency (RF) signal based on data to be transmitted. The power amplifier circuit amplifies and transmits the RF signal to the antenna system through a transmission line. Thereafter, the antenna system radiates the amplified RF signal. In order to maximize the total radiated power of the antenna system, the impedance driving the antenna should be equal to the complex conjugate of the impedance of the antenna system. The impedances of the amplifier output network and the antenna system may vary because of various factors, such as, but not limited to, frequency of the RF signal, orientation of the antenna, presence of foreign objects near the antenna and manufacturing variations in the amplifier and output network.

SUMMARY OF THE INVENTION

In an embodiment, a system for compensating impedance mismatch at an output terminal of a power amplifier is provided. The system includes one or more samplers to measure a first set of parameters associated with an amplified signal being generated by the power amplifier. Further, the system includes a processing unit to vary an impedance of an impedance element based on the first set of parameters. The impedance element is connected to the output terminal of the power amplifier.

In another embodiment, a method for compensating impedance mismatch at an output terminal of a power amplifier is provided. The method includes generating an amplified signal. The method further includes measuring a first set of parameters associated with the amplified signal. The method further includes varying an impedance of an impedance element, based on the first set of parameters. The impedance element is connected to the output terminal of the power amplifier.

Directional coupler for measuring the RF signal for automatic impedance matching is known in the art. The present invention discloses samplers for measuring one or more parameters associated with the RF signal. Directional couplers are difficult to fabricate in comparison to samplers. Further, directional couplers consume a large amount of space on the laminate of the Printed circuit board (PCB). Thus the use of samplers in power amplifier circuit is provides several advantages to the circuitry,

BRIEF DESCRIPTION OF DRAWINGS

Various embodiments of the invention will, hereinafter, be described in conjunction with the appended drawings provided to illustrate and not to limit the invention, wherein like designations denote like elements, and in which.

DETAILED DESCRIPTION OF DRAWINGS

The detailed description of the appended drawings is intended as a description of some of the embodiments of the present disclosure, and is not intended to represent the only form in which the present invention may be practiced. It is to be understood that the same or equivalent functions may be accomplished by different embodiments that are intended to be encompassed within the spirit and scope of the present disclosure.

The invention proposes systems and methods for compensating for impedance mismatch in a power amplifier circuit. The improved system includes a plurality of samplers for measuring one or more parameters associated with signal generated by the power amplifier. The plurality of samplers occupies less space on the laminate in comparison to the directional couplers used in the conventional systems.

Figure 1:
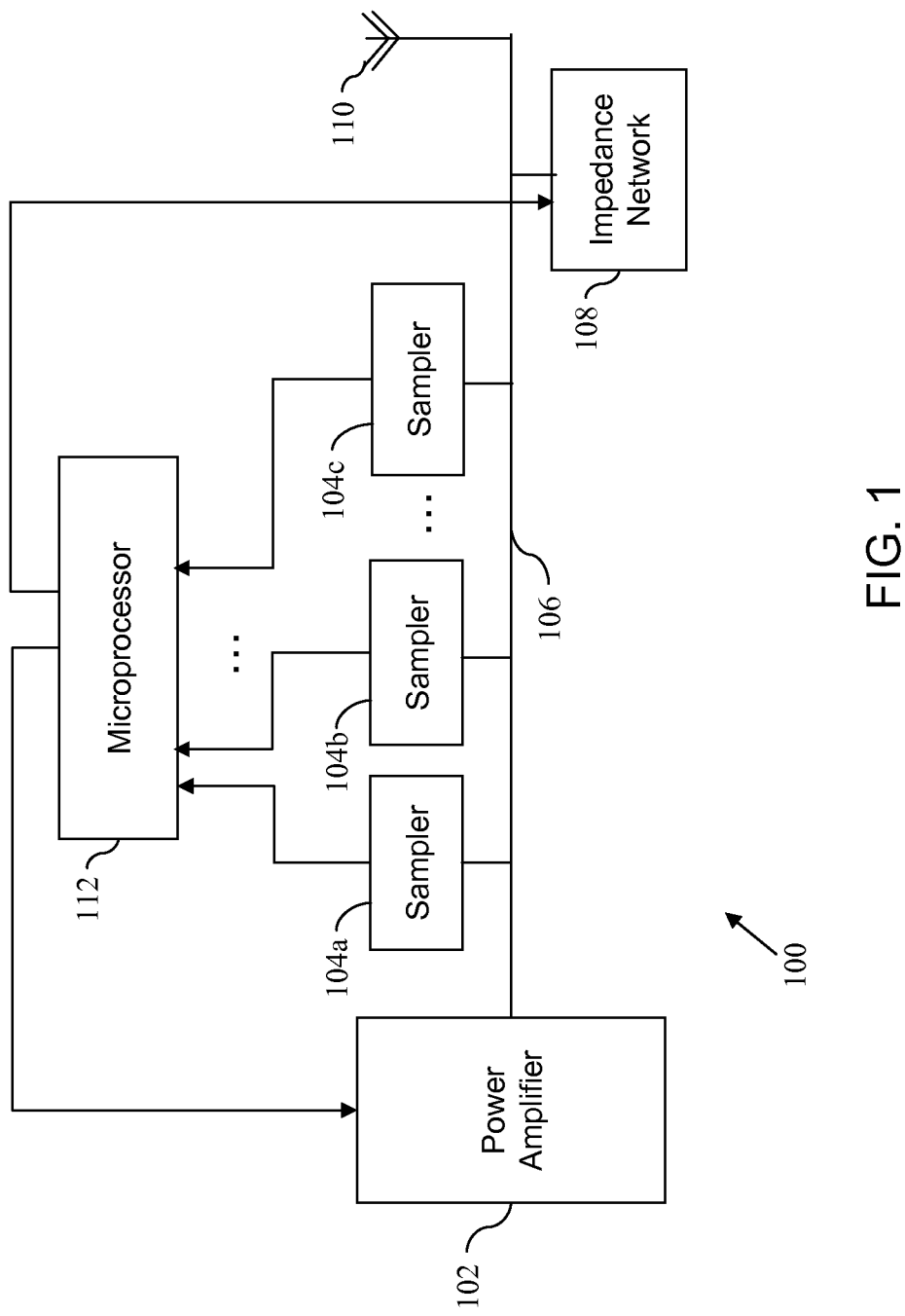
FIG. 1 is a block diagram of a system for compensating impedance mismatch at an output terminal of a power amplifier in accordance with an embodiment of the invention.

FIG. 1 illustrates a block diagram of a system 100 for compensating impedance mismatch at an output terminal of a power amplifier in accordance with an embodiment of the invention. The system 100 includes a power amplifier 102, a plurality of samplers 104a, 104b, 104c (generally referred as 104), a transmission line 106, an impedance network 108, an antenna 110 and a microprocessor 112.

The transmission line 106 connects the power amplifier 102, the plurality of samplers 104, the impedance network 108, and the antenna 110. In an embodiment of the invention, each of the plurality of samplers 104 (e.g. 104a) are placed on the transmission line based on the impedance of the transmission line, frequency of the RF signal, and power of the RF signal Each of the plurality of samplers 104 also connect to the microprocessor 112. The microprocessor 112 is connected to the power amplifier 102 and the impedance network 108.

The power amplifier 102 receives an RF signal from an external source (not shown). The power amplifier 102 amplifies the RF signal to generate an amplified RF signal. In an embodiment, the power amplifier 102 includes a plurality of RF transistors (not shown) that may be arranged in one or more known configurations such as, but are not limited to, Class A, Class B, Class C, Class AB, Class D, and Class E.

The plurality of samplers 104 measures one or more parameters associated with the amplified RF signal generated by the power amplifier 102. In an embodiment, each of the plurality of samplers 104 is a standard high impedance CMOS I/Q mixer that measures the one or more parameters associated with the amplified RF signal. In an embodiment, the one or more parameters include a complex voltage (in-phase and quadrature voltage components) of the RF signal.

In an embodiment, the transmission line 106 is a medium through which the amplified RF signal is transmitted to the antenna 110. In an embodiment, the transmission line 106 is fabricated on a laminate as a RF micro strip. In another embodiment, the transmission line 106 may be implemented as a trace on a circuit board or using equivalent lumped elements, inductors and capacitors.

In an embodiment, the impedance network 108 includes one or more variable impedance elements such as a resistive element, a capacitive element, and an inductance element. In an embodiment, the impedance of the impedance network 108 in parallel with that of the antenna is equal to the complex conjugate of the combination of the output impedance of the power amplifier 102 and the distributed impedance of the transmission line 106.

The microprocessor 112 is a processing unit that is configured to receive the measured one or more parameters from the plurality of samplers 104. The microprocessor 112 may be realized through a number of processor technologies known in the art. Example of the microprocessor 112 can be, but is not limited to, X86 processor, RISC processor, ASIC processor, CSIC processor, or any other processor.

In operation, the power amplifier 102 receives an RF signal from an external source. The power amplifier 102 amplifies the RF signal to generate an amplified RF signal. Thereafter, the power amplifier 102 transmits the amplified RF signal to the antenna 110 over the transmission line 106. It is to be appreciated by a person skilled in the art that the antenna 110 radiates a first portion of the amplified RF signal. The remaining portion of the RF signal reflects back towards the power amplifier 102 from the antenna 110. In an embodiment, the first portion of the amplified RF signal is forward traveling RF signal. The remaining portion of the amplified RF signal is a reverse traveling RF signal.

The plurality of samplers 104 measure a first set of parameters associated with the amplified RF. In an embodiment, the first set of parameters includes complex voltage of the sum of the forward travelling signal and the reverse traveling signal. Thereafter, the plurality of samplers 104 transmit the first set of parameters to the microprocessor 112.

The microprocessor 112 calculates a second set of parameters associated with the transmission line 106 based on the first set of parameters. In an embodiment, the second set of parameters include the voltage amplitude of the forward travelling RF signal and the reverse travelling RF signal at various nodes on the transmission line 106. The calculation of the second set of parameters is explained in detail in conjunction with FIG. 2 and FIG. 3. Thereafter, based on the second set of parameters, the microprocessor 112 generates an actuating signal. It will be appreciated by a person skilled in the art that the microprocessor 112 maintains a look-up table for determining a magnitude of the actuating signal. In an embodiment, the look-up table may include the magnitude of the actuating signal for every possible second set of parameters. In an alternative embodiment, the microprocessor 112 calculates the magnitude of the actuating signal based on the second set of parameters.

In an exemplary embodiment, based on the actuating signal, the microprocessor 112 varies the impedance of the impedance network 108 in order to compensate for the impedance mismatch. In an alternative embodiment, based on the actuating signal, the microprocessor 112 varies the gain of the power amplifier 102. In another alternative embodiment, based on the actuating signal, the microprocessor 112 varies the magnitude of a bias current of the power amplifier 102. In yet another embodiment, based on the actuating signal, the microprocessor 112 varies output power of the antenna 110. The components of the invention may be embodied as discrete components, separate integrated circuits or large scale integrated circuits.

Figure 2:
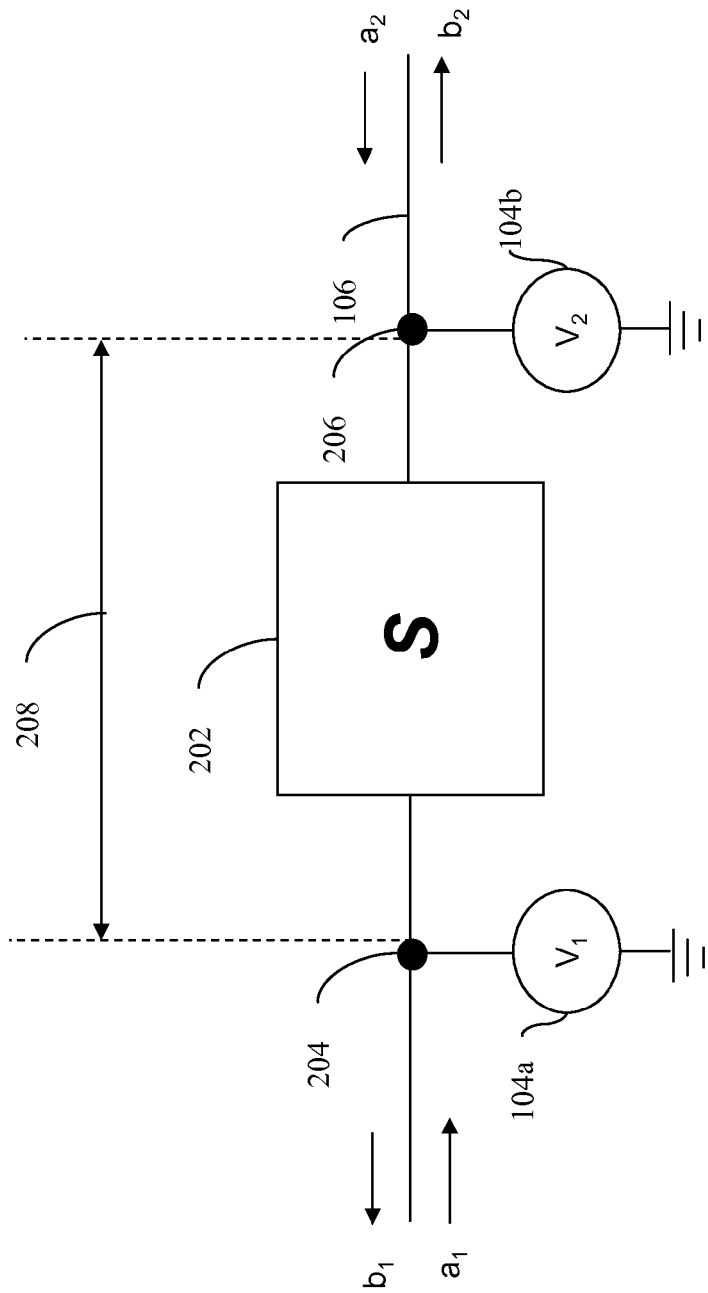
FIG. 2 illustrates an exemplary pair of samplers in accordance with an embodiment of the invention.

FIG. 2 illustrates a pair of exemplary samplers 104a and 104b in accordance with an embodiment. FIG. 2 is explained in conjunction with FIG. 1

The samplers 104a and 104b (refer FIG. 1) are connected to the transmission line 106. The transmission line 106 acts as a medium for a forward travelling RF signal and a reverse travelling RF signal. In an embodiment, a section of the transmission line 208 between the two samplers 104a and 104b may be treated as a two-port network device 202. In an embodiment, the samplers 104a and 104b can be considered as vector voltmeters. The sampler 104a measures a complex voltage that is the sum of the forward travelling RF signal and the reverse travelling RF signal at node 204. The sampler 104b measures the sum of the forward and reverse travelling RF signals at node 206. Thereafter, the samplers 104a and 104b transmit the complex voltage measurements of the RF signal to the microprocessor 112. The microprocessor 112 calculates the voltage amplitude of the forward travelling RF signal and the reverse travelling RF signal, at node 204 and 206, based on the complex voltage measurements received from the samplers 104a and 104b respectively.

Figure 3:
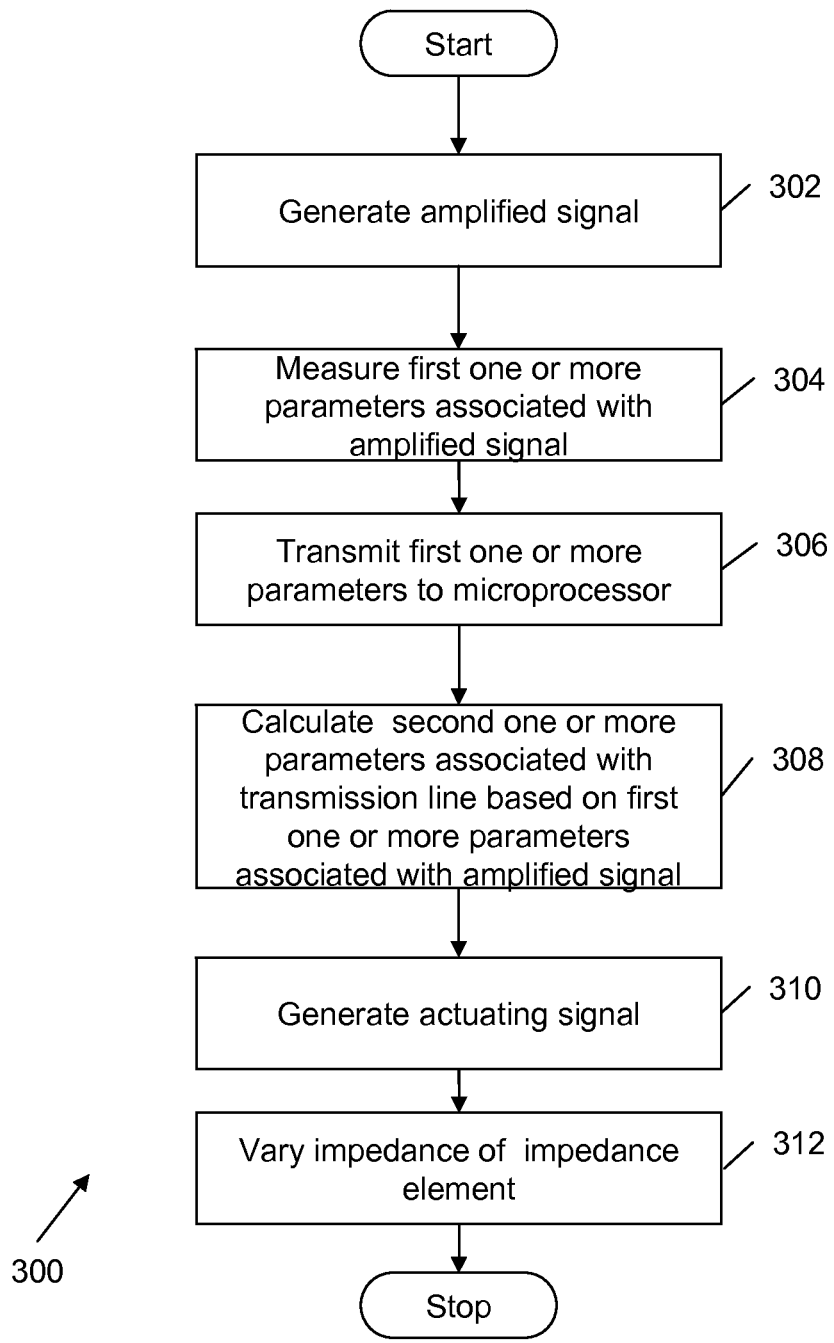
FIG. 3 is a flowchart illustrating a method to compensate for impedance mismatch at an output terminal of a power amplifier in accordance with an embodiment of the invention.

FIG. 3 is a flowchart 300 illustrating a method for compensating impedance mismatch at an output terminal of a power amplifier in accordance with an embodiment of the invention. The flowchart 300 is explained in conjunction with FIG. 1 and FIG. 2.

At step 302, the power amplifier 102 (refer FIG. 1) generates an amplified RF signal. Thereafter, the power amplifier 102 transmits the amplified RF signal via the transmission line 106 to the antenna 110.

At step 304, the plurality of samplers 104 measures a first set of parameters associated with the amplified RF signal. In an embodiment, the plurality of samplers 104 measures the first set of parameters associated with a forward travelling RF signal and a reverse travelling RF signal as explained in FIG. 2.

At step 306, the plurality of samplers 104 transmit the first set of parameters to the microprocessor 112. Thereafter, at step 308, the microprocessor 112 calculates a second set of parameters associated with the transmission line 106 based on the first set of parameters. For calculating the second set of parameters, the microprocessor 112 considers the section of the transmission line (e.g. section 208 shown in FIG. 2) between each of the plurality of samplers 104 as a two port network device 202. The two port network device 202 is mathematically represented by a plurality of S parameters. In an embodiment, the plurality of S parameters are indicative of input port voltage reflection coefficient, a reverse voltage gain, a forward voltage gain, and an output port voltage reflection coefficient of the transmission line 106. In an embodiment, the S parameters are determined through a factory calibration procedure of the power amplifier module, or may be known by design.

Based on the first set of parameters and the plurality of S parameters, the microprocessor 112 calculates a first set of the second set of parameters. In an embodiment, the second set of parameters may be calculated using Equation 1 and Equation 2.

$$\begin{pmatrix} V_1 \\ V_2 \end{pmatrix} = \sqrt{Z_0} \begin{pmatrix} 1+S_{11} & S_{12} \\ S_{21} & 1+S_{22} \end{pmatrix} \begin{pmatrix} a_1 \\ a_2 \end{pmatrix} \qquad (1)$$

Where,
$V_1$=Complex voltage measured by sampler 104a at node 204.
$V_2$=Complex voltage measured by sampler 104b at node 206
$Z_0$=Characteristic impedance of the transmission line 106
$S_{11}, S_{21}, S_{22}, S_{21}$=Plurality of predefined S parameters
$a_1$=Voltage amplitude of forward travelling wave at node 204.
$a_2$=Voltage amplitude of reverse travelling wave at node 206.
The microprocessor 112 substitutes the values of $a_1$ and $a_2$ in Equation 2 to calculate the remaining of the second set of parameters, $b_1$ and $b_2$.

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix} \qquad (2)$$

$b_1$=Voltage amplitude of reverse travelling wave at node 204.
$b_2$=Voltage amplitude of reverse travelling wave at node 206.

Subsequent to the calculation of the second set of parameters, at step 310, the microprocessor 112 generates an actuating signal based on the second set of parameters.

At step 312, based on the actuating signal, the microprocessor 112 varies impedance of the impedance network 108 in order to compensate for the impedance mismatch. In an alternative embodiment, based on the actuating signal, the microprocessor 112 varies gain of the power amplifier 102. In another embodiment, based on the actuating signal, the microprocessor 112 varies a magnitude of a bias current of the power amplifier 102. In yet another embodiment, based on the actuating signal, the microprocessor 112 varies output power of the antenna 110.

The invention described above has numerous advantages. The invention discloses the usage of samplers for measuring one or more parameters associated with the amplified RF signal. In an embodiment, the sampler is a CMOS I/Q mixer device that would occupy less space on a laminate in comparison to directional couplers being used in the conventional systems. Further, the samplers can be placed at any points on the transmission line based on the S parameters of the section of the transmission line. Thus, there is no need for extra circuitry to separate forward travelling RF signal and reverse travelling RF signal.

While the various embodiments of the invention have been illustrated and described, it will be clear that the invention is not limited only to these embodiments. Numerous modifications, changes, variations, substitutions, and equivalents will be apparent to those skilled in the art, without departing from the spirit and scope of the invention.

What is claimed is:

1. A system for compensating impedance mismatch at an output terminal of a power amplifier, the system comprising:
a plurality of samplers to measure a first set of parameters associated with an amplified signal being generated by the power amplifier; and
a processing unit to:
vary an impedance of an impedance element based on the first set of parameters, wherein the impedance element is connected to the output terminal of the power amplifier, and
calculate a second set of parameters associated with a transmission line based on the first set of parameters.

2. The system of claim 1, wherein the amplified signal comprises a forward travelling signal and a reverse travelling signal.

3. The system of claim 2, wherein the first set of parameters comprises a set of complex voltages associated with a linear combination of the forward travelling signal and the reverse travelling signal.

4. The system of claim 2, wherein the second set of parameters include voltage amplitude of the forward travelling signal and reverse travelling signal.

5. The system of claim 1, wherein each of the plurality of samplers correspond to a high impedance complex voltage sensing device.

6. The system of claim 1, wherein the processing unit varies a gain of the power amplifier based on the first set of parameters.

7. The system of claim 1, wherein the plurality of samplers and the impedance element are connected to the output terminal of the power amplifier through a transmission line.

8. The system of claim 1, wherein the power amplifier is an RF power amplifier.

9. A method for compensating impedance mismatch at an output terminal of a power amplifier, the method comprising:
generating an amplified signal;
measuring a first set of parameters associated with the amplified signal;
varying an impedance of an impedance element, based on the first set of parameters, wherein the impedance element is connected to the output terminal of the power amplifier; and
calculating a second set of parameters associated with a transmission line based on the first set of parameters.

10. The method of claim 9 further comprising transmitting the first set of parameters to a processing unit.

11. The method of claim 9 further comprising generating an actuating signal based, at least in part, on the first set of parameters.

12. The method of claim 11 further comprising varying a gain of the power amplifier based on the actuating signal.

13. The method of claim 11, wherein the actuating signal is generated based at least in part on the second set of parameters and the transmission line connecting the impedance element to the output terminal of the power amplifier.

14. The method of claim 13, wherein the amplified signal comprises a forward travelling signal and a reverse travelling signal.

15. The method of claim 14 wherein the second set of parameters include a voltage amplitude of the forward travelling signal and reverse travelling signal.

16. The method of claim 14, wherein the first set of parameters include a voltage magnitude associated with the forward travelling signal and the reverse travelling signal.

* * * * *